US 6,656,668 B2

(12) United States Patent
Tsai et al.

(10) Patent No.: US 6,656,668 B2
(45) Date of Patent: Dec. 2, 2003

(54) PROCESS METHOD OF USING EXCIMER LASER FOR FORMING MICRO SPHERICAL AND NON-SPHERICAL POLYMERIC STRUCTURE ARRAY (75) Inventors: Hung-Yin Tsai, Hsinchu (TW); Cheng-Tang Pan, TaiNan (TW); Min-Chieh Chou, Taipei (TW); Shih-Chou Chen, Hsinchu (TW); Yuh-Sheng Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/934,654

(22) Filed: Aug. 23, 2001

(65) Prior Publication Data
US 2002/0110755 A1 Aug. 15, 2002

Related U.S. Application Data (63) Continuation of application No. 09/779,655, filed on Feb. 9, 2001.

(51) Int. Cl.$^7$ ............... G03F 7/00; B23K 26/00; G03C 5/00
(52) U.S. Cl. ............... 430/396; 430/311; 430/320; 430/321; 430/323; 430/397; 430/945; 216/26
(58) Field of Search ............... 430/311, 320, 430/321, 323, 397, 945; 216/26

(56) References Cited

U.S. PATENT DOCUMENTS 5,230,990 A * 7/1993 Iwasaki et al. ............. 430/321
5,331,131 A * 7/1994 Opdyke ................. 219/121.69

* cited by examiner

Primary Examiner—Mark F. Huff
Assistant Examiner—Kripa Sagar
(74) Attorney, Agent, or Firm—Troxell Law Office PLLC (57) ABSTRACT A process method of using excimer laser for forming micro spherical and non-spherical polymeric structure array includes a photomask which has a selected curved pattern formed thereon. The curved pattern has non-constant widths along a straight line direction. An excimer laser beam source is deployed to project through the photomask on a substrate coated with a polymeric material while the substrate is moving in a direction normal to the straight line direction for the polymeric material to receive laser beam projection with different time period. The polymeric material thus may be etched to different depth to form a three dimensional pattern desired. By projecting and etching the polymeric material two times at different directions or through different photomask patterns, a sphere like or non-sphere like surface of micro array structure may be obtained.

20 Claims, 7 Drawing Sheets

PROCESS METHOD OF USING EXCIMER LASER FOR FORMING MICRO SPHERICAL AND NON-SPHERICAL POLYMERIC STRUCTURE ARRAY

RELATED APPLICATIONS

This is a Continuation application of U.S. Ser. No. 09/779,655, filed Feb. 9, 2001, entitled PROCESS METHOD OF USING EXCIMER LASER FOR FORMING MICRO SPHERICAL AND NON-SPHERICAL POLYMERIC STRUCTURE ARRAY, now abandoned.

BACKGROUND OF THE INVENTION

1. Field of the Invention

This invention relates to a process method of using excimer laser for forming micro spherical and non-spherical polymeric structure array and particularly a excimer laser process to form a micro spherical array structure on a substrate for producing a metal mold to fabricate liquid crystal display (LCD) face plate or photosensitive face plate.

2. Description of the Prior Art

In order to increase visibility angle of LCD screen or other photosensitive plate, the face plate of these devices generally has to form a plurality of bulged micro spherical array structure to enhance light condensing (or dispersing) property. This micro spherical array structure usually is made by means of pressing of a metal mold. The metal mold (pressing mold) is formed by spray plating a metal layer on a main mold, then peeling off the metal layer from the main mold.

Figure 1A:
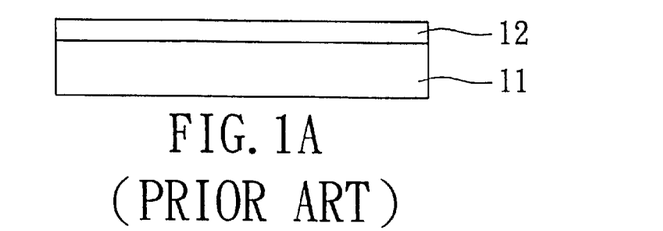
FIGS. 1A–1D are schematic views of process steps of a conventional single stepper exposure and high temperature reflow process.
Figure 1B:
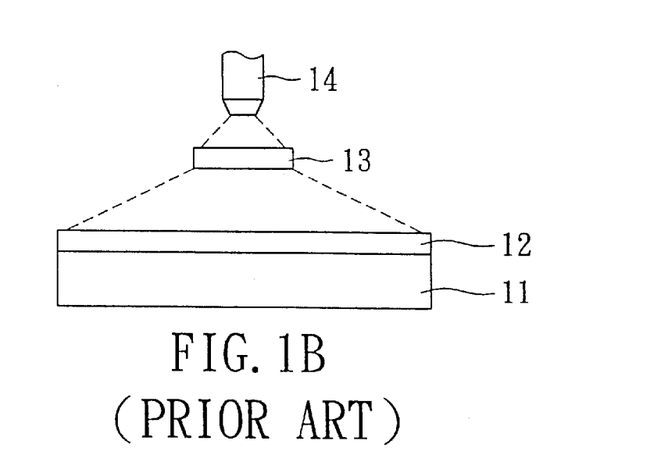
Figure 1C:
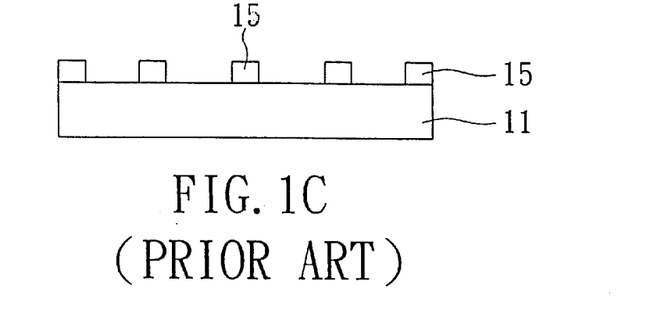
Figure 1D:
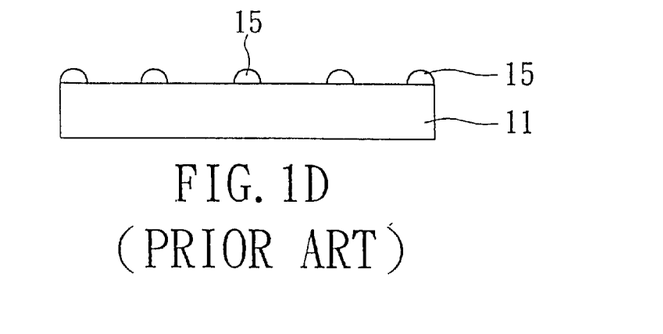

Conventionally, fabricating the main mold include the following methods:

1. Using single stepper exposure and high temperature reflow process:

As shown in FIGS. 1A through 1D, this process firstly prepares a substrate 11 coated with a photoresist layer 12 (FIG. 1A). Then using a stepper 14 to proceed single stepping exposure by zones on the substrate 11 through a photomask 13 (FIG. 1B). Afterward, the non-exposure portion of the photoresist 12 is cleared through chemical agents and resulting in a micro-struts photoresist 15 array structure (FIG. 1C). Thereafter, using high temperature reflow process to heat the substrate around or exceeding the photoresist melting temperature to melt the surface of the micro-struts photoresist 15 for forming a curve shaped surface 16 (FIG. 1D).

This method has the following disadvantages: 1. It needs high temperature reflow process. The process is time consuming and highly unstable. It is difficult to precisely control the spherical surface formation. 2. Stepping exposure process can only produce two dimensional (2D) strut structure, but not spherical or non-spherical three dimensional (3D) curved surfaces.

2. Multiple stepping exposure micro photo process.

In the multiple stepping exposure micro process, the step 1B and 1C set forth above are repeatedly performed with different photomasks to gradually expand the exposure area of the photoresist until a pyramid-shaped photoresist structure is formed. Then the high temperature reflow process is proceeded. The reflow process may be done at a lower temperature and shorter time period. The spherical surface is also easier to control. However it has more and complicated process steps. It takes more process time and costs higher. To clean the photoresist needs a lot of chemicals and may result in severe environmental pollution problem.

Figure 2A:
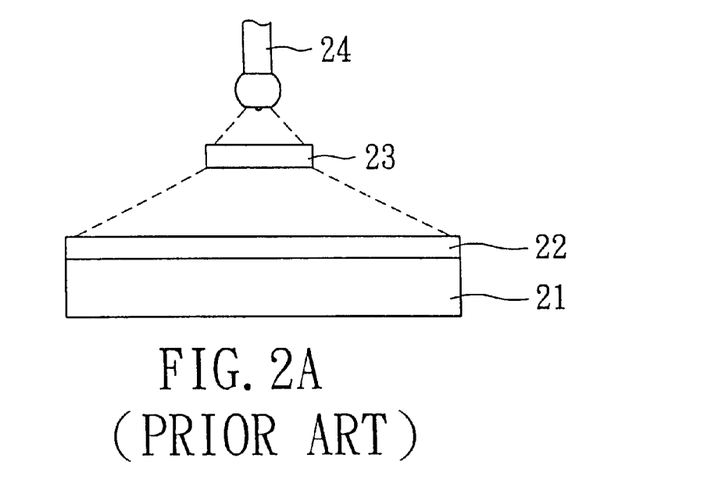
FIGS. 2A and 2B are schematic views of process steps of a conventional photosensitive glass process.
Figure 2B:
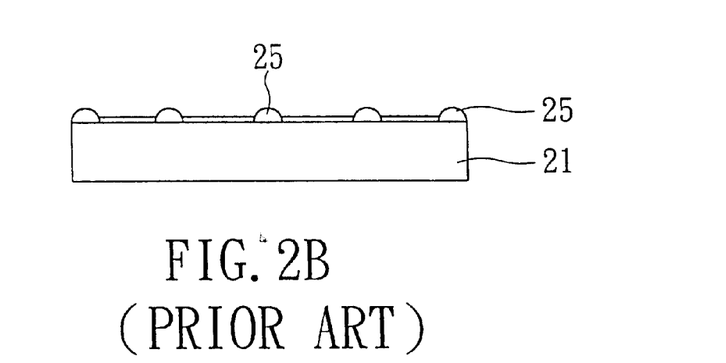

3. Photosensitive glass process:

As shown in FIGS. 2A and 2B, this process firstly uses an ultraviolet light source 24 (UV) to perform stepping exposure on a photosensitive glass 21 through a photomask 23 (FIG. 2A). The photosensitive glass 21 is coated with a different type of photosensitive material 22 which will be hardened and expanded upon the projection of ultraviolet light. The non-exposure portion of the photosensitive material will be squeezed and to form a bulged structure 25 (FIG. 2B).

However this process also has disadvantages. For instance, the photosensitive glass is very expensive and difficult to procure. The bulged structure is also difficult to control accurately.

Figure 3:
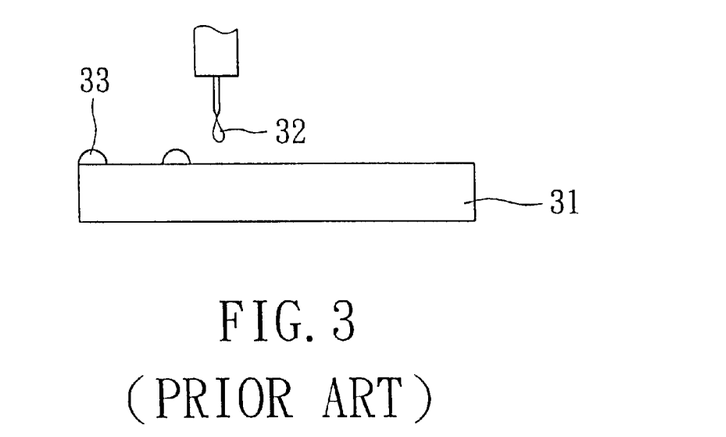
FIG. 3 is schematic view of the process of a conventional heated dripping process.

4. Heated dripping process:

As shown in FIG. 3, this process forms the bulged 3D structure 33 by means of dripping heated photoresist 32 one by one (or multiple drops at a time) on the substrate 31. The drawback of this process is that it totally cannot control the micro spherical array structure formation.

All the conventional techniques set forth have their share of shortcomings. There is still room for improvement.

SUMMARY OF THE INVENTION

It is therefore an object of this invention to provide a process method of using excimer laser for forming spherical and non-spherical polymeric structure array that may precisely form micro spherical or non-spherical surface array structure on a substrate in a simpler and lower cost way.

It is another object of this invention to provide a process method of using excimer laser for forming spherical and non-spherical polymeric structure array that uses a photomask which has a selected curved pattern to receive excimer laser beam projection upon a polymeric material coated on a substrate. The curved pattern has different width along a straight line. The excimer laser beam hits the polymeric material and peels the material to create etching effect. During the laser beam projection and etching process, the substrate may be moved normally against the straight line direction so that the polymeric material may receive projection of different time period along the straight line direction to obtain different depth of etching for forming the 3D pattern desired.

For achieving aforesaid objects, the process of this invention includes the follow steps:

a. preparing a substrate which has a surface coating with a polymeric material and at least one photomask having a selected curved pattern formed thereon, b. using a excimer laser beam source to project through the photomask on the polymeric material on the substrate and moving the substrate along a first corresponding direction for etching and forming a first 3D pattern on the polymeric material, c. moving the substrate along a second corresponding direction and projecting the excimer laser beam through the photomask on the first 3D pattern to form a second 3D pattern in spherical-like manner.

In another aspect, this invention may further include the following steps:

d. using chemical etching method to remove debris of the polymeric material, e. performing surface process to smooth the surface of the second 3D pattern, f. spray plating a seed layer on the substrate and second 3D pattern, g. electroplating the spray plated seed layer to form a metal layer to a selected thickness, h. separating the metal layer from the substrate and second 3D pattern to make the metal layer become a metal mold for pressing a micro array structure.

BRIEF DESCRIPTION OF THE DRAWINGS

The invention, as well as its many advantages, may be further understood by the following detailed description and drawings, in which.

DETAILED DESCRIPTION OF THE PREFERRED EMBODIMENT

This invention aims at providing a process method of using excimer laser for forming spherical and non-spherical polymeric structure array. The process employs a photomask which has a selected curved pattern formed thereon. The curved pattern has various width along a straight line direction. When an excimer laser beam projects through the photomask on a substrate coated with a polymeric material, the polymeric material will be peeled off to produce etching result. During the projection and etching process, the substrate is moved along a normal direction against the straight line direction for the polymeric material to receive laser beam projection of different time period along the straight line direction. Then the polymeric material will be etched to different depth to form a 3D pattern desired.

Figure 4A:
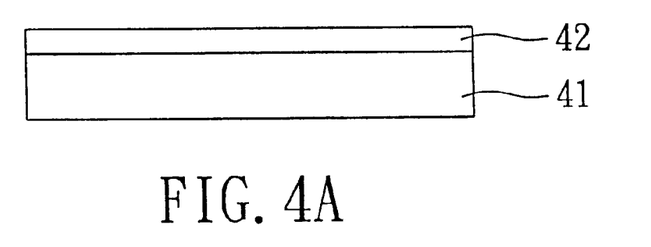
FIGS. 4A–4G are schematic views of the process steps of an embodiment of this invention for forming micro spherical and non-spherical surface in polymeric structure array.
Figure 4B:
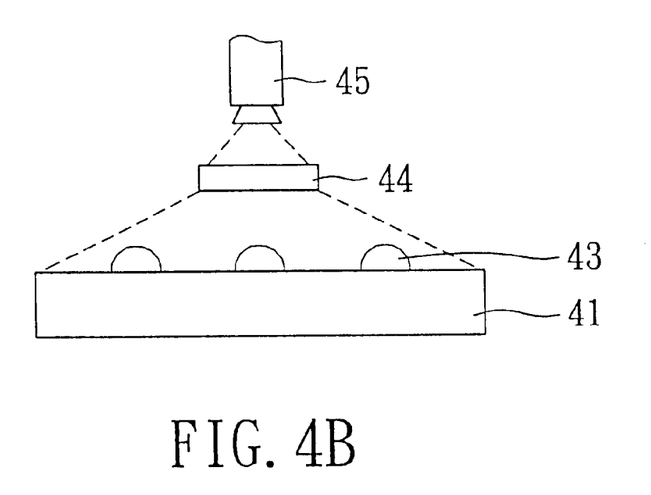

FIGS. 4A through 4G show a preferred embodiment of this invention. It includes the following steps:

a. Preparing a substrate 41 which has a surface coating with a polymeric material 42 and preparing at least one photomask 44 which has a selected curved pattern formed thereon (FIG. 4B). The polymeric material 42 is preferably selected from the group which has relatively lower key link energy, such as photoresist material, so that the key link may be broken down by laser beam projection for etching purpose. The polymeric material 42 may be coated on the substrate 41 by means of rotary spindle, printing, chemical deposition and the like. The substrate 41 is preferably made from material which may resist excimer laser etching and may become a stop layer of etching, such as silicon or semiconductor substrate.

b. Using an excimer laser beam source 45 to projecting the laser beam through the photomask 44 to the polymeric material 42 on the substrate 41, in the mean time (during laser beam projection) moving the substrate 41 along a first corresponding direction to form an etching first 3D pattern 43 on the polymeric material 42 (FIG. 4B). This process is different from conventional stepping exposure process using a stepper.

The first corresponding direction is normal to the straight line. Hence when the excimer laser beam source 45 projects the moving substrate 41 through the photomask 44, the polymeric material 42 receives laser beam projection with different time period along the straight line direction, and may result in different degree of etching for forming the first 3D pattern 43.

c. When necessary (depending on the finishing 3D pattern desired), the excimer laser beam source 45 may be deployed to project the first 3D pattern through the photomask 44 again while moving the substrate 41 along a second corresponding direction to form a second 3D pattern. In a preferred embodiment of this invention, the second corresponding direction is normal to the first corresponding direction. The curved pattern on the photomask 44 used at the step b and c may be the same or different.

In another embodiment of this invention, the second corresponding direction at the step c may be taken by turning the substrate 41 ninety degree after the step b, then performing the step c process along the first corresponding direction. It may also produce the second 3D pattern with same result as the relative moving corresponding direction in the step c and b is also normal against each other.

Figure 4C:
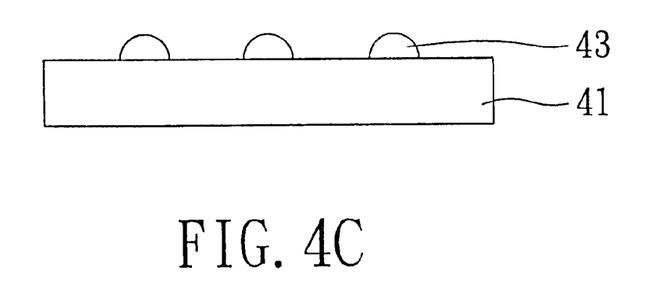
Figure 4D:
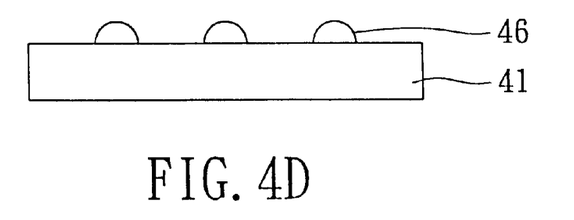
Figure 4E:
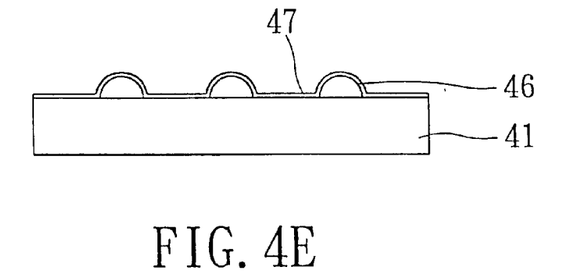
Figure 4F:
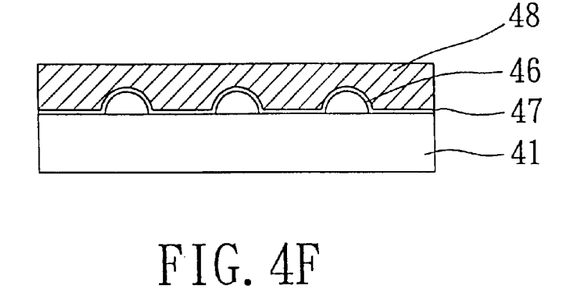
Figure 4G:
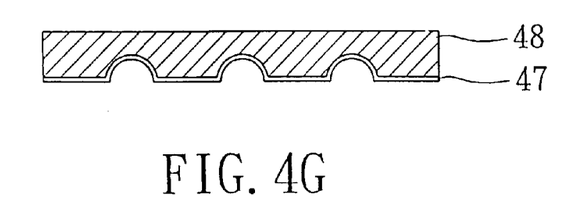

In yet another embodiment, multiple laser beam projections may be done if projection by two times is not adequate. The relative moving corresponding direction between the photomask 44 and substrate 41 may be the same or different for every laser beam projection, or the photomask 44 of different curved pattern may be used (in such a case, the moving corresponding direction may be the same) until a desired 3D pattern is obtained.

d. Clearing the polymeric material debris by means of a chemical etching process as shown in FIG. 4C. As the etching process through the excimer laser beam projection might produce some peeled off debris of polymeric material scattering on the substrate 41 or 3D pattern 43, these debris may be cleared and removed rapidly be means of the chemical etching process.

e. Smoothing the surface 46 of the 3D pattern 43 (the first or second 3D pattern) (FIG. 4D). As the second 3D pattern is already sphere-like, this step may be done by means of a low temperature process to melt a small amount of the surface for producing the smooth surface desired. For instance, by performing low temperature reflow diffusion at a temperature lower than the melting point (Tg) of the polymeric material, rapid processing using high energy beam, or rapid tempering annealing (RTA) and the like.

f. Spray plating metallic material on the substrate 41 and 3D pattern to form a seed layer 47 (FIG. 4E). The seed layer material is preferably nickel or its alloy.

g. Electroplating a metallic material on the seed layer 47 to a selected thickness to form a metal layer 48 (FIG. 4F). The metal layer 48 is preferably nickel or its alloy.

h. Separating the metal layer 48 from the substrate 41 and second 3D pattern to become an independent component (FIG. 4G). The separated metal layer 48 then may be used as the mold for producing the micro array structure desired.

Figure 5A:
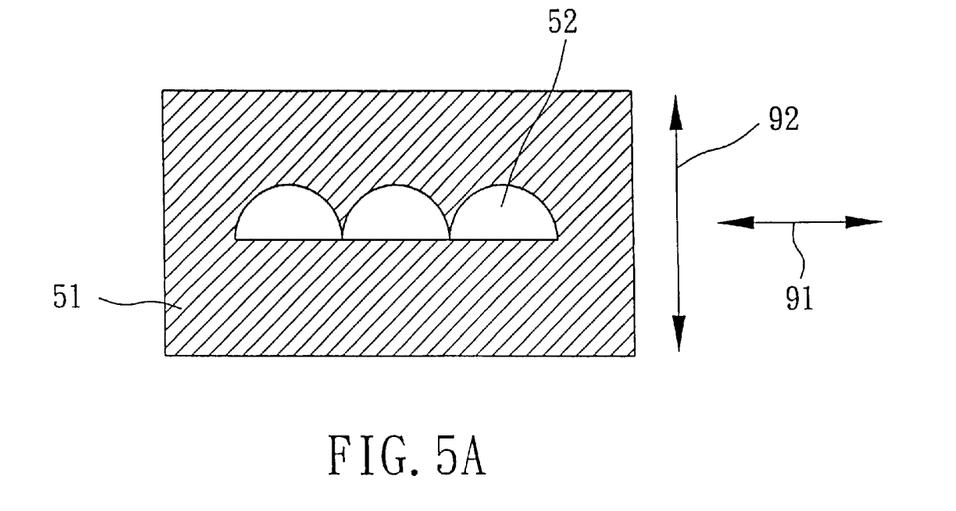
FIG. 5A is a front view of a selected curved pattern on a photomask for this invention.
Figure 5B:
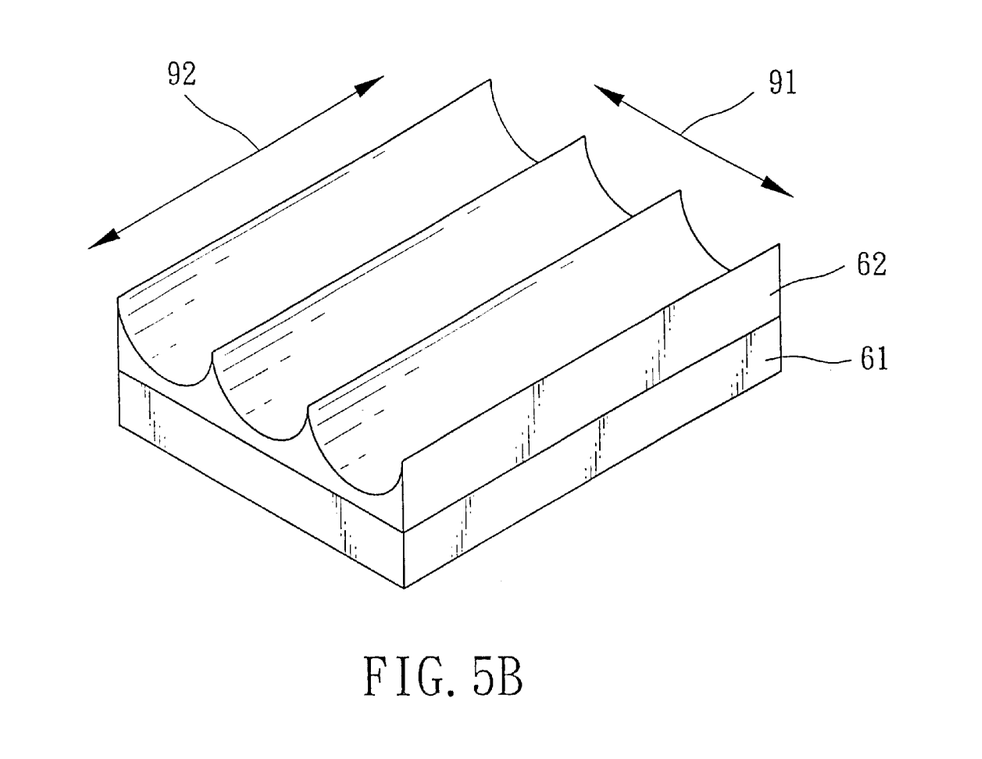
FIG. 5B is a perspective view of a first 3D pattern formed by means of the photomask shown in FIG.5A.

FIGS. 5A and 5B show respectively an embodiment of a curved pattern on the photomask and a first 3D pattern which might be formed therewith. The photomask 51 has a plurality of semicircle transparent zones 52 in the straight line direction 91. The width of the transparent zones 52 in the straight line direction 91 is not a constant value (FIG. 5A). When the substrate 61 is moved along a first corresponding direction 92 (normal to the straight line direction 91) for receiving laser beam projection and etching, the polymeric material on the substrate 61 receives projection of different time period and forms a first 3D pattern 62 which consists of a plurality of semicircle concave troughs (FIG. 5B).

Figure 6A:
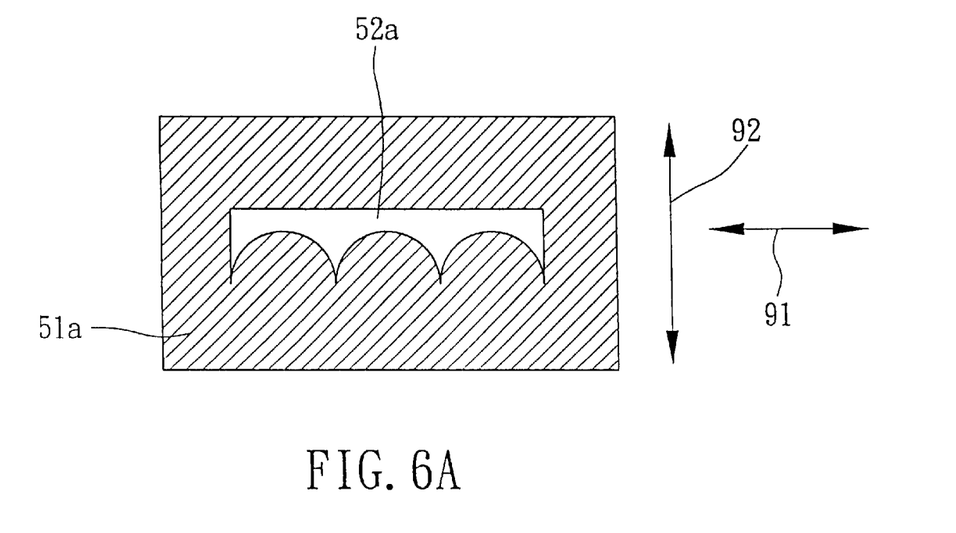
FIG. 6A is a front view of another selected curved pattern on a photomask for this invention.
Figure 6B:
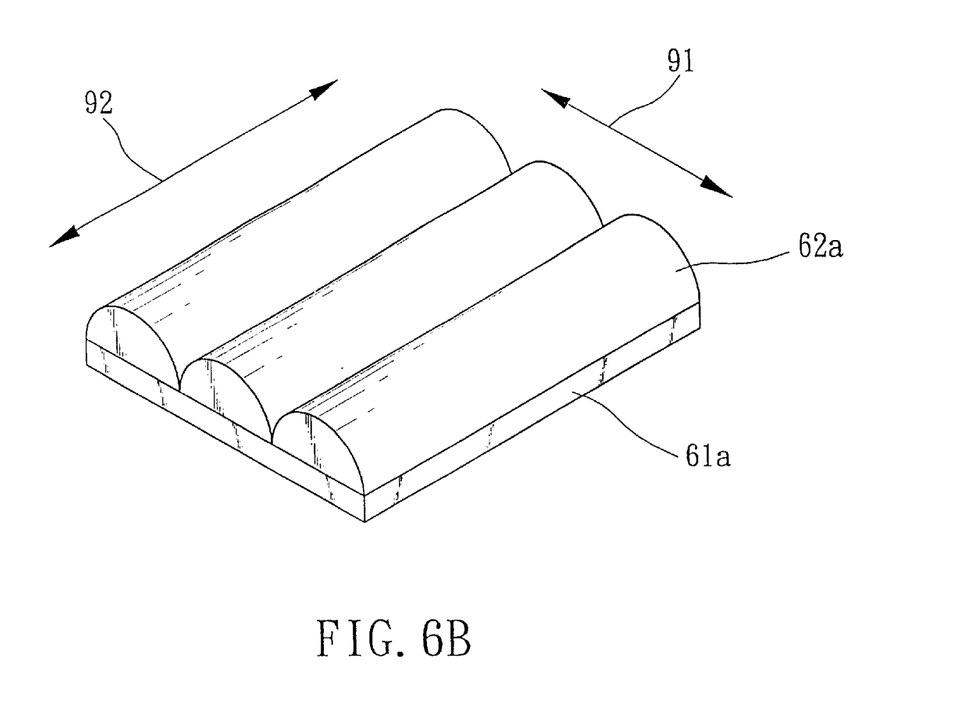
FIG. 6B is a perspective view of a first 3D pattern formed by means of the photomask shown in FIG.6A.
Figure 7:
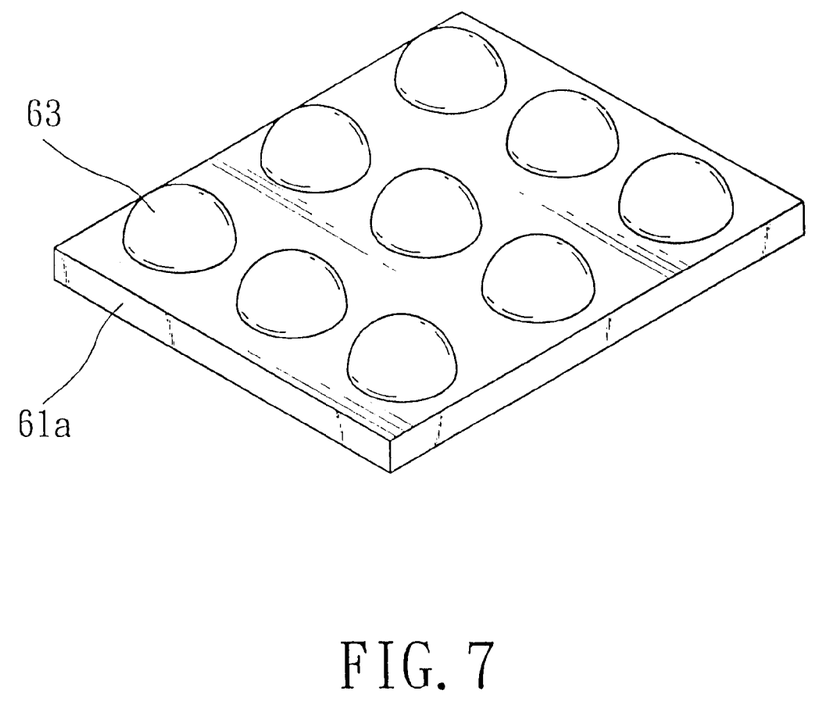
FIG. 7 is a schematic perspective view of a spherical micro array stricture, after the polymeric material subjects to photo etching for two times.

FIGS. 6A and 6B show respectively another embodiment of a curved pattern on the photomask 51a and a first 3D pattern which might be formed therewith. By means of similar processes shown in FIGS. 5A and 5B, the photomask 51a has a selected pattern which includes transparent zones 52a for forming a first 3D pattern 62a of protrusive semi cylindrical structure on the substrate 61a. When the substrate 61a is turned ninety degree and be etched one more time using the photomask 51a, a second 3D pattern 63 as shown in FIG. 7 may be obtained which nearly becomes semispherical structure.

Of course, besides the semispherical 3D pattern structure, this invention may be used to produce other types of 3D pattern structure such as ellipsoidal surface, corrugated surface and the like. It may be done by using different curved pattern desired on the photomask and projecting laser beam by different times or moving at different corresponding directions.

In summary, this invention offers the following advantages over conventional techniques:

1. Using excimer laser beam source to project through the photomask to perform process may easily and accurately form sphere-like micro structure. Then using a low temperature reflow diffusion process may obtain a smooth surface desired.
2. Resolving the problem incurred in conventional technique which needs high temperature reflow process after forming circle strut structure through the single step micro photo process.
3. Comparing with complex and lengthy process of conventional multiple steps micro photo process for forming pyramid type structure, this invention has simpler process and shorter process time.
4. This invention may have different process parameters for forming different types of non-spherical micro stricture, such as changing the pattern on the photomask, changing moving corresponding direction during laser beam projection process.
5. This invention may accurately produce sphere or non-sphere surface micro structure. Process control is much more easier and precise than conventional technique which uses bulging or heated dripping process.
6. This invention is lower cost than conventional technique that uses photosensitive glass.

It may thus be seen that the objects of the present invention set forth herein, as well as those made apparent from the foregoing description, are efficiently attained. While the preferred embodiments of the invention have been set forth for purpose of disclosure, it would be obvious to those skilled in the art that various other changes and modifications can be made without departing from the spirit and scope of this invention.

What is claimed is:

1. A method of using an excimer laser for forming a polymeric structure array, which comprises the steps of:
   a) coating a surface of a substrate with a polymeric material;
   b) providing an excimer laser;
   c) providing at least one photomask between the excimer laser and the substrate, the photomask having a transparent zone oriented in a straight line, a width of the transparent zone continuously varying along the straight line;
   d) projecting a first excimer laser beam through the transparent zone of the photomask onto the polymeric material on the substrate while simultaneously moving the substrate in a first direction perpendicular to the straight line of the transparent zone to form an etched first three dimensional pattern in the polymeric material; and
   e) projecting a second excimer laser beam through the transparent zone of the photomask onto the first three dimensional pattern on the substrate while simultaneously moving the substrate in a second direction, different than the first direction, to form an etched second three dimensional pattern in the polymeric material.

2. The method of using an excimer laser for forming a polymeric structure array according to claim 1, wherein the polymeric material coating the surface of the substrate is a photoresist material.

3. The method of using an excimer laser for forming a polymeric structure array according to claim 1, wherein the coating step comprises a process selected from the group consisting of rotary spindle coating, printing, and chemical deposition.

4. The method of using an excimer laser for forming a polymeric structure array according to claim 1, wherein the substrate is a semiconductor substrate.

5. The method of using an excimer laser for forming a polymeric structure array according to claim 1, wherein the second direction that the substrate is moved is normal to the first direction.

6. The method of using an excimer laser for forming a polymeric structure array according to claim 1, wherein a single photomask is used in projecting the first and second laser beams.

7. The method of using an excimer laser for forming a polymeric structure array according to claim 1, wherein a first photomask having a first transparent zone, and a second photomask having a second transparent zone are provided, and wherein the first photomask used for the first excimer laser beam and the second photomask is used for the second excimer laser beam.

8. The method of using an excimer laser for forming a polymeric structure array according to claim 1, wherein the first direction that the substrate is moved is the same direction as the second direction that the substrate is moved in the second projecting step.

9. The method of using an excimer laser for forming a polymeric structure array according to claim 1, wherein the steps of projecting the first and second laser beams are repeated until desired first and second three dimensional patterns are formed.

10. The method of using an excimer laser for forming a polymeric structure array according to claim 1, wherein the second three dimensional pattern formed by the second projecting step has a semi-spherical shape.

11. The method of using an excimer laser for forming a polymeric structure array according to claim 1, which further comprises the step of:

clearing polymeric material debris by using a chemical etching process.

12. The method of using an excimer laser for forming a polymeric structure array according to claim 1, which further comprises the step of:

smoothing a surface of the second three dimensional pattern.

13. The method of using an excimer laser for forming a polymeric structure array according to claim 12, wherein the smoothing step uses a process selected from the group consisting of high energy beam rapid process, rapid tempering annealing process, and reflow diffusion process performed at a temperature lower than a melting point of the polymeric material.

14. The method of using an excimer laser for forming a polymeric structure array according to claim 1, which further comprises the steps of:

a) spraying a metallic plating material on the second three dimensional pattern to form a seed layer;
   b) electroplating a metallic material on the seed layer to form a metal layer; and
   c) separating the metal layer from the substrate and the second three dimensional pattern to form a mold.

15. A method of using an excimer laser for forming a micro spherical and non-spherical polymeric structure array, which comprises the steps of:

a) coating a surface of a substrate with a polymeric material;
   b) providing an excimer laser;
   c) providing at least one photomask between the excimer laser and the substrate, the photomask having a transparent zone oriented in a straight line, a width of the transparent zone continuously varying along the straight line; and,
   d) projecting a first excimer laser beam through the transparent zone of the photomask onto the polymeric material while simultaneously moving the substrate in a first direction to form an etched first three dimensional pattern in the polymeric material.

16. The method of using an excimer laser for forming a micro spherical and non-spherical polymeric structure array according to claim 15, which further comprises the step of:

a) rotating the substrate 90°; and
   b) projecting a second excimer laser beam through the transparent zone of the photomask onto the first three dimensional pattern while simultaneously moving the substrate in a second direction to form an etched second three dimensional pattern in the polymeric material.

17. The method of using an excimer laser for forming a micro spherical an non-spherical polymeric structure array according to claim 16, which further comprises the steps of:

a) clearing polymeric material debris by using a chemical etching process; and
   b) smoothing a surface of the second three dimensional pattern.

18. The method of using an excimer laser for forming a micro spherical and non-spherical polymeric structure array according to claim 17, wherein the smoothing step uses a process selected from the group consisting of high energy beam rapid process, rapid tempering annealing process, and reflow diffusion process performed at a temperature lower than a melting point of the polymeric material.

19. The method of using an excimer laser for forming a micro spherical a non-spherical polymeric structure array according to claim 17, which further comprises the steps of:

a) spraying metallic plating material on the second three dimensional pattern to form a seed layer;
   b) electroplating a metallic material on the seed layer to form a metal layer; and
   c) separating the metal layer form the substrate and the second three dimensional pattern to form a mold.

20. The method of using an excimer laser for forming a micro spherical a non-spherical polymeric structure array according to claim 15, wherein the at least one photomask includes a first photomask and a second photomask, having first and second transparent zones, respectively, wherein the first photomask is used in projecting the first laser beam and the second photomask is used in projecting the second laser beam.

* * * * *